US 6,617,903 B2

(12) United States Patent
Kawamura

(10) Patent No.: US 6,617,903 B2
(45) Date of Patent: Sep. 9, 2003

(54) INVERTER CIRCUIT HAVING AN IMPROVED SLEW RATE

(75) Inventor: Yukio Kawamura, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/901,131

(22) Filed: Jul. 10, 2001

(65) Prior Publication Data

US 2003/0011415 A1 Jan. 16, 2003

(30) Foreign Application Priority Data

Jul. 10, 2000 (JP) .................................. 2000-208003

(51) Int. Cl.[7] .............................................. H03H 11/26
(52) U.S. Cl. ..................... 327/261; 327/263; 327/264; 327/112; 326/24
(58) Field of Search .................................. 327/108, 112, 327/261, 263, 264, 389, 391, 170; 326/22, 23, 24, 86, 87

(56) References Cited

U.S. PATENT DOCUMENTS 5,672,983 A * 9/1997 Yamamoto et al. ........... 326/27
5,717,343 A * 2/1998 Kwong ......................... 326/27

* cited by examiner

Primary Examiner—Timothy P. Callahan
Assistant Examiner—An T. Luu
(74) Attorney, Agent, or Firm—Volentine Francos, PLLC

(57) ABSTRACT

An inverter circuit includes a first transistor connected between an input terminal and a gate of a second transistor, a second transistor connected between power supply voltage and an output terminal, a third transistor connected between an input terminal and a gate of a fourth transistor and a fourth transistor connected between a ground and the output terminal.

18 Claims, 6 Drawing Sheets

INVERTER CIRCUIT HAVING AN IMPROVED SLEW RATE

The present application claims priority under 35 U.S.C. §119 to Japanese Application No. 2000-208003 filed on Jul. 10, 2000, which is hereby incorporated by reference in its entirely for all purposes.

BACKGROUND OF THE INVENTION

1. Field of the Invention

The present invention relates to an integrated circuit. In particular, the invention relates to an inverter circuit.

2. Description of the Related Art

An inverter is sometimes used as a delay circuit in an integrated circuit. A conventional inverter includes one N channel MOSFET (NMOS) and a P channel MOSFET (PMOS), and an inputted signal is inverted by the inverter. A delay of signal is caused during this inverting operation.

However, the delay circuit, which is composed by conventional inverters, has to have a plurality of conventional inverters according to a delay time and a logic level of an outputted signal. Therefore, an area of the delay circuit becomes wide. It is difficult to reduce the area of the delay circuit by using conventional inverters.

SUMMARY OF THE INVENTION

An inverter circuit includes a first transistor connected between an input terminal and a gate of a second transistor, a second transistor connected between power supply voltage and an output terminal, a third transistor connected between an input terminal and a gate of a fourth transistor and a fourth transistor connected between a ground and the output terminal.

DETAILED DESCRIPTION OF THE PREFERRED EMBODIMENTS

The preferred embodiments are described below with reference to drawings.

Figure 1:
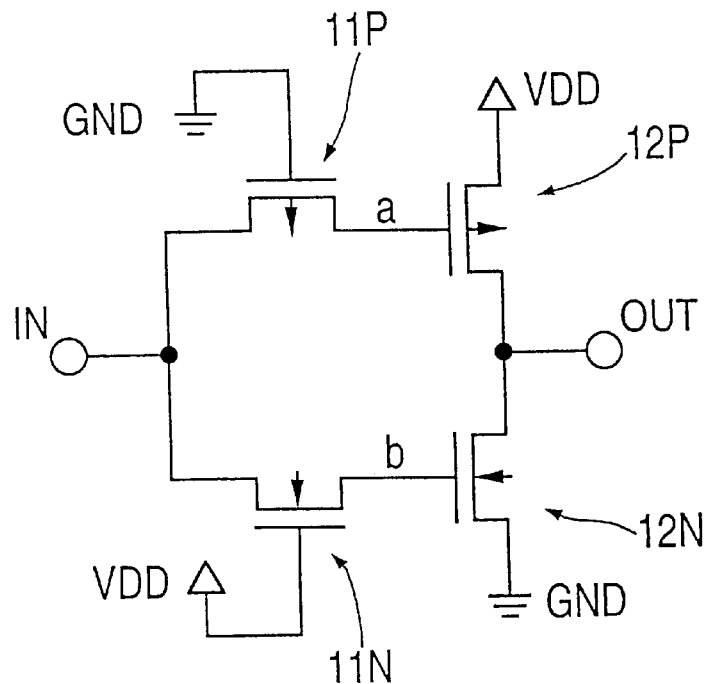
FIG. 1 shows a circuit diagram of the first preferred embodiment of the present invention.

FIG. 1 is a circuit diagram of an inverter circuit 10 of a first preferred embodiment. The inverter circuit 10 includes a first N channel MOSFET (NMOS) 11N and a second NMOS 12N as a first conductive type MOSFET. The inverter circuit 10 includes a first P channel MOSFET (PMOS) IP and a second PMOS 12P as a second conductive type MOSFET.

A source of the first PMOS 11P is connected to an input terminal IN, a drain of the first PMOS 11P is connected to a gate electrode of the second PMOS 12P (node a), and a gate of the PMOS 11P is connected to ground GND (a first supplied voltage). A source of the second PMOS 12P is connected to a power supply voltage VDD (a second supplied voltage), a drain of the second PMOS 12P is connected to an output terminal OUT, and a gate of the PMOS 12P is connected to the drain of the first PMOS 11P (node a) as shown in FIG. 1.

A source of the first NMOS 11N is connected to a gate electrode of the second NMOS 12N (node b), a drain of the first NMOS 11N is connected to an input terminal IN, and a gate of the NMOS 11N is connected to the power supply voltage VDD. A source of the second NMOS 12N is connected to ground GND, a drain of the second NMOS 12N is connected to an output terminal OUT, and a gate of the NMOS 11N is connected to the source of the first NMOS 11N (node b).

Figure 2:
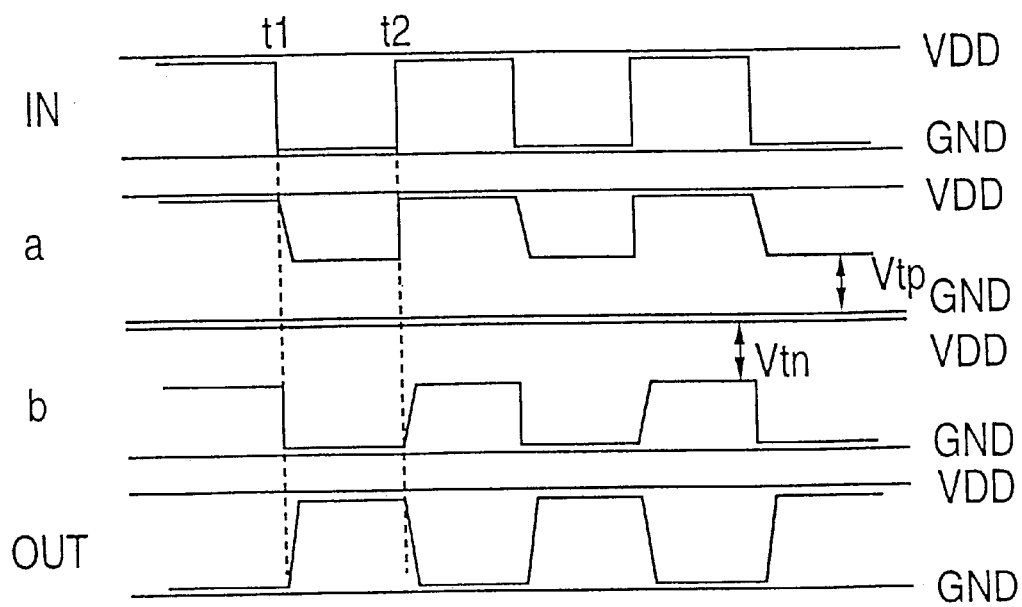
FIG. 2 shows wave patterns of the first preferred embodiment of the present invention.

FIG. 2 shows wave patterns of the first preferred embodiment. Each wave pattern corresponds to a wave pattern which is shown at the input terminal IN, node a, node b and the output terminal OUT, respectively. A trailing edge delays at node a, and a rising edge delays at node b as shown in FIG. 2. Therefore, a rising edge and a trailing edge delay at the output terminal OUT. Reasons why the trailing edge at node a and the rising edge at node b delay are described below. A threshold voltage of PMOS 11P is expressed by Vtp, and a threshold voltage of NMOS 11N is expressed Vtn hereinafter.

Before an inputted signal is dropped to a ground level at the input terminal, the node a is in a VDD level. When the inputted signal is dropped to the ground level at the input terminal (t1), a gate-to-source voltage Vgs of PMOS 11P is equal to a difference between a potential of node a and a gate voltage (ground GND) of PMOS 11P. The gate-to-source voltage is decreased according to the potential of node a. Therefore, a current which passes PMOS 11P is also decreased, and the trailing edge at node a delays.

When the gate-to-source voltage Vgs becomes the threshold voltage Vtp, PMOS 11P becomes an off state. Therefore, node a has the potential which is equal to the threshold voltage Vtp in the first preferred embodiment. A conventional value of the threshold voltage Vtp is about 0.6V.

Before an inputted signal is dropped to the ground level at the input terminal, the node is in a (VDD−Vtn) level. When the inputted signal is dropped to the ground level at the input terminal (t1), a gate-to-source voltage Vgs of NMOS 11N is equal to a difference between the potential of the input terminal IN and a gate voltage (VDD) of NMOS 11N. The gate-to-source voltage is high enough to pass a sufficient current. Therefore, the rising edge at node b does not delay at time t1.

Before an inputted signal rise up to VDD level at the input terminal, the node a has Vtp level. When the inputted signal rise up to VDD level at the input terminal (t2), the gate-to-source voltage Vgs of PMOS 11P is equal to a difference between the input terminal IN and a gate voltage (GND) of PMOS 11P. The gate-to-source voltage is enough to pass a sufficient current. Therefore, the rising edge at node a does not delay at time t2.

Before an inputted signal rise up to the VDD level at the input terminal, the node b has GND level. When the inputted signal rise up to VDD level at the input terminal (t2), a gate-to-source voltage Vgs of NMOS 11N is equal to a difference between node b and the gate voltage (VDD) of NMOS 11N. The gate-to-source voltage is decreased according to the potential of node b. Therefore, a current which passes NMOS 11N is also decreased, and the rising edge at node b delays.

As described above, the trailing edge of the output signal OUT, which corresponds to the rising edge of the input signal IN, and the rising edge of the output signal, which corresponds to the trailing edge of the input signal IN delay. The delay is longer than a conventional inverter. The area of the circuit also can be reduced.

Figure 3:
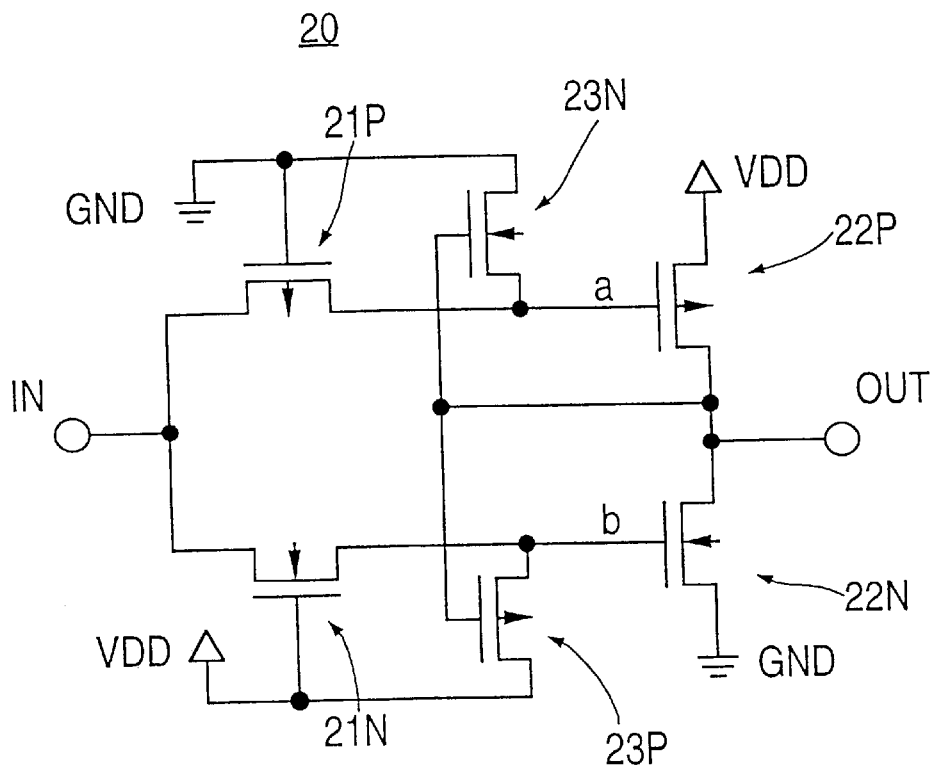
FIG. 3 shows a circuit diagram of the second preferred embodiment of the present invention.

FIG. 3 shows the inverter circuit 20 of a second preferred embodiment. The inverter circuit 20 includes a first N channel MOSFET (NMOS) 21N, a second NMOS 22N and a third NMOS 23N, as a first conductive type MOSFET. The inverter circuit 20 includes a first P channel MOSFET (PMOS) 21P, a second PMOS 22P and a third PMOS 23P, as a second conductive type MOSFET.

A source of the first PMOS 21P is connected to an input terminal IN, a drain is connected to a gate electrode of the second PMOS 22P (node a), and a gate of the PMOS 21P is connected to ground GND (a first supplied voltage). A source of the second PMOS 22P is connected to a power supply voltage VDD (a second supplied voltage), a drain is connected to an output terminal OUT, and a gate is connected to the drain of the first PMOS 21P. A source of the third PMOS 23P is connected to the power supply voltage VDD (a second supplied voltage), a drain is connected to a gate electrode of the second NMOS 22N (node b), and a gate of the PMOS 23P is connected to the output terminal OUT.

A source of the first NMOS 21N is connected to a gate electrode of the second NMOS 22N (node b), a drain is connected to an input terminal IN, and a gate of the NMOS 21N is connected to the power supply voltage VDD (a second supplied voltage). A source of the second NMOS 22N is connected to an output terminal OUT, a drain is connected to ground GND (a first supplied voltage) and a gate is connected to the source of the first NMOS 21N. A source of the third NMOS 23N is connected to the ground GND (a first supplied voltage), a drain is connected to a gate electrode of the second PMOS 22P (node a), and a gate of the NMOS 23N is connected to the output terminal OUT.

Figure 4:
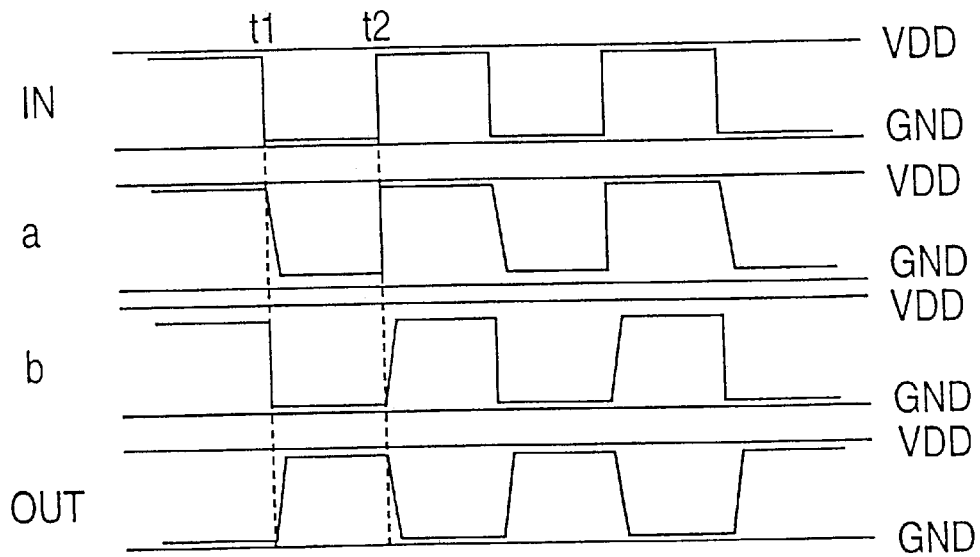
FIG. 4 shows wave patterns of the second preferred embodiment of the present invention.

An operation of the inverter circuit 20 of the second preferred embodiment os described below. FIG. 4 shows wave patterns of the second preferred embodiment. Each wave pattern correspondes t a wave pattern which os shown at the input terminal IN, node a, node b and the output terminal OUT, respectively. A trailing edge delays at node a, and a resing edge delays at node b as shown in FIG. 4. Therefore, a rising edge and a trailing edge delay at the output terminal OUT.

When the inputted signal is dropped to a ground level at the input terminal (t1), a potential of the node a is decreased, and a potential of the output terminal OUT is increased. These operations are the same as the first preferred embodiment. However, the potential of the output terminal is applied to the gate of NMOS 23N in the second preferred embodiment. Therefore, the potential of the node a is finally decreased to the ground level in this embodiment.

When the inputted signal is rise up to the VDD level at the input terminal (t2), a potential of the node b is increased, and a potential of the output terminal OUT is decreased. These operations are the same as the first preferred embodiment. However, the potential of the output terminal is applied to the gate of PMOS 23P in the second preferred embodiment. Therefore, the potential of the node a is finally increased to the VDD level in this embodiment.

The inverter circuit 20 of the second preferred embodiment can have a enough difference between the gate and the source of the PMOS 22P, also can have a enough difference between the gate and the source of the NMOS 22N. Therefore, a drive ability of the inverter circuit 20 is improved.

Figure 5:
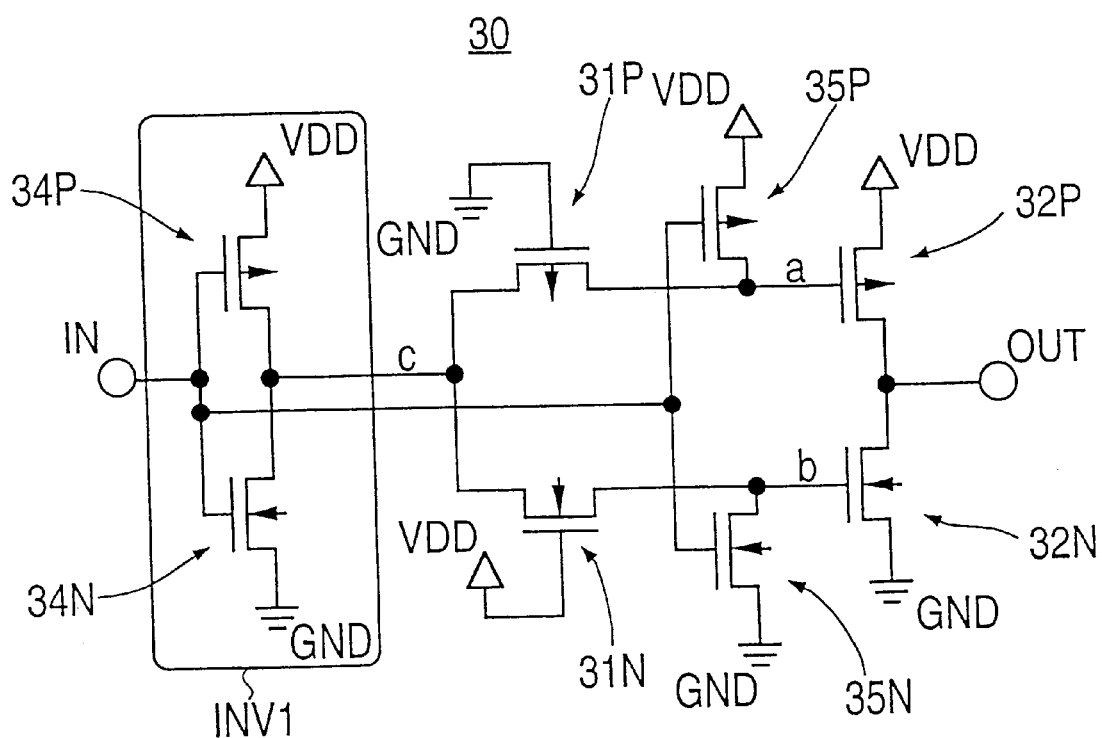
FIG. 5 shows a circuit diagram of the third preferred embodiment of the present invention.

FIG. 5 shows the inverter circuit 30 of a third preferred embodiment. The inverter circuit 30 includes a NMOS 31N, a NMOS 32N, a NMOS 35N, and a NMOS 34N. The inverter circuit 30 also includes a PMOS 31P, a PMOS 32P, a PMOS 35P and a PMOS 34P.

The PMOS 34P and the NMOS 34N are connected in series between the VDD level and the ground level. A source of the first PMOS 34P is connected to the source of PMOS 31P (node c), a drain is connected to the VDD level and a gate of the PMOS 34P is connected to the input terminal IN. A source of the first NMOS 34N is connected to the source of NMOS 31N (node c), a drain is connected to the ground level and a gate of the NMOS 34N is connected to the input terminal IN. That is to say, PMOS 34P and NMOS 34N forms an inverter INV1.

A source of the first PMOS 31P is connected to node c, a drain is connected to a gate electrode of the second PMOS 32P (node a), and a gate of the PMOS 31P is connected to the ground GND. A source of the second PMOS 32P is connected to a power supply voltage VDD, a drain is connected to an output terminal OUT, and a gate is connected to the drain of the first PMOS 31P. A source of the third PMOS 35P is connected to the power supply voltage VDD, a drain is connected to a gate electrode of the second PMOS 32P (node a), and a gate of the PMOS 35P is connected to the input terminal IN.

A source of the first NMOS 31N is connected to the node c, a drain is connected to a gate electrode of the second NMOS 32N (node b), and a gate of the NMOS 31N is connected to power supply voltage VDD. A source of the second NMOS 32N is connected to ground, a drain is connected to an output terminal OUT, and a gate is connected to the drain of the NMOS 31N. A source of the third NMOS 35N is connected to ground, a drain is connected to a gate electrode of the second NMOS 32N (node b), and a gate of the NMOS 35N is connected to the input terminal IN.

When the inputted signal is dropped to a ground level at the input terminal, a potential of the node c rise up. The operation, when the level of node c rises up, is the same as the second preferred embodiment. However, the potential of the input terminal IN is applied to the gate of NMOS 35N in the third preferred embodiment. Therefore, the potential of the node a is rapidly increased, and PMOS 32P rapidly becomes off state.

When the inputted signal rises up to VDD level at the input terminal, a level of the node c is dropped. The operation, when the level of node c is dropped, is the same as the second preferred embodiment. However, the signal of the input terminal IN is applied to the gate of PMOS 35P in the third preferred embodiment. Therefore, the potential of the node b is rapidly increased, and NMOS 32N rapidly becomes off state.

The inverter circuit of the third preferred embodiment has an advantage that the characteristic of the slew rate is improved in addition to the advantage of the first preferred embodiment.

Figure 6:
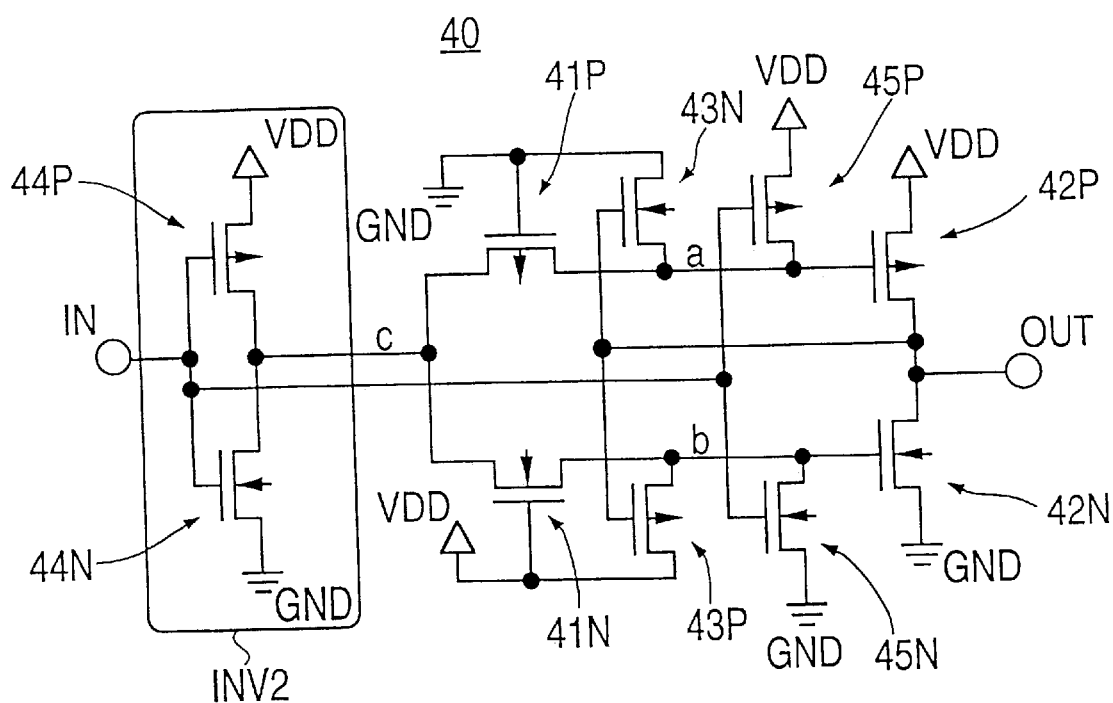
FIG. 6 shows a circuit diagram of the fourth preferred embodiment of the present invention.

FIG. 6 shows the inverter circuit 40 of a fourth preferred embodiment. The inverter circuit 40 includes a NMOS 41N, a NMOS 42N, a NMOS 43N, a NMOS 44N and a NMOS 45N. The inverter circuit 40 includes a PMOS 41P, a PMOS 42P, a PMOS 43P, a PMOS 44P and a PMOS 45P.

The PMOS 44P and the NMOS 44N are connected in series between the VDD level and the ground level. A source of the PMOS 44P is connected to the source of PMOS 41P (node c), a drain is connected to VDD level and a gate of the PMOS 44P is connected to the input terminal IN. A source of the NMOS 44N is connected to the source of NMOS 41N (node c), a drain is connected to the ground level and a gate of the NMOS 44N is connected to the input terminal IN. That is to say, PMOS 44P and NMOS 44N forms an inverter INV2.

A source of the PMOS 41P is connected to node c, a drain is connected to a gate electrode of the PMOS 42P (node a), and a gate of the PMOS 41P is connected to the ground GND. A source of the second PMOS 42P is connected to a power supply voltage VDD, a drain is connected to an output terminal OUT, and a gate is connected to the drain of the PMOS 41P. A source of the PMOS 43P is connected to the power supply voltage VDD, a drain is connected to a gate electrode of the second NMOS 42N (node b), and a gate of the PMOS 43P is connected to the output terminal OUT. A source of the PMOS 45P is connected to the power supply voltage VDD, a drain is connected to a gate electrode of the NMOS 42N (node b), and a gate of the PMOS 45P is connected to the input terminal IN.

A source of the NMOS 41N is connected to node c, a drain is connected to a gate electrode of the NMOS 42N (node b), and a gate of the NMOS 41N is connected to the VDD level. A source of the NMOS 42N is connected to ground, a drain is connected to an output terminal OUT, and a gate is connected to the drain of the NMOS 41N. A source of the NMOS 43N is connected to the ground GND, a drain is connected to a gate electrode of the PMOS 42P (node a), and a gate of the NMOS 43N is connected to the output terminal OUT. A source of the NMOS 45N is connected to ground, a drain is connected to a gate electrode of the NMOS 42N (node b), and a gate of the NMOS 45N is connected to the input terminal IN.

The operations of PMOS 41P, PMOS 42P, PMOS 43P, NMOS 41N, NMOS 42N and NMOS 43N of the fourth preferred embodiment are the same as the operations of PMOS 21P, PMOS 22P, PMOS 23P, NMOS 21N, NMOS 22N and NMOS 23N of the second preferred embodiment. The operations of PMOS 44P, PMOS 45P, NMOS 44N and NMOS 45N of the fourth preferred embodiment are the same as the operations of PMOS 34P, PMOS 35P, NMOS 34N and NMOS 35N of the third preferred embodiment.

The inverter circuit 40 of the fourth preferred embodiment has advantages of the second and third embodiments. The drive ability and the slew rate of the inverter circuit are improved.

Figure 7:
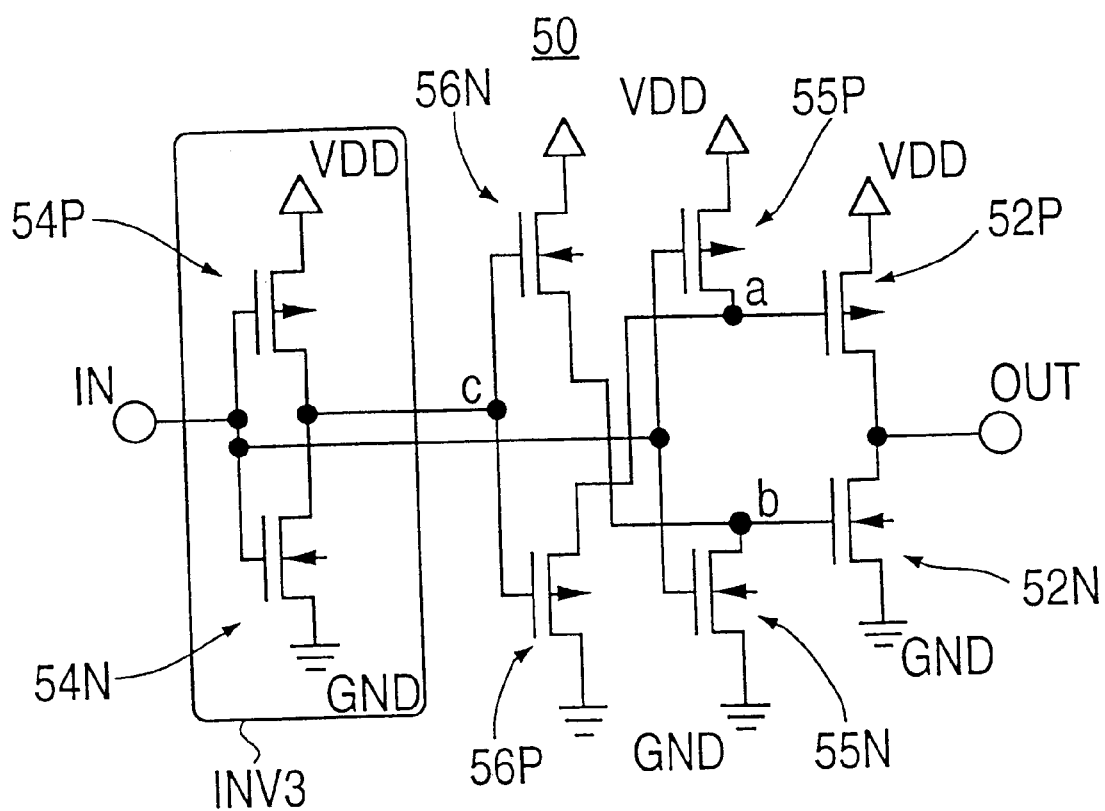
FIG. 7 shows a circuit diagram of the fifth preferred embodiment of the present invention.

FIG. 7 shows the inverter circuit 50 of a fifth preferred embodiment. The inverter circuit 50 includes a NMOS 52N, a NMOS 54N, a NMOS 55N, and a NMOS 56N. The inverter circuit 50 includes a PMOS 52P, a PMOS 54P, a PMOS 55P and a PMOS 56P.

The PMOS 54P and the NMOS 54N are connected in series between the VDD level and the ground level. A source of the PMOS 54P is connected to VDD level, a drain is connected to the gate of PMOS 56P (node c) and a gate of the PMOS 54P is connected to the input terminal IN. A source of the NMOS 54N is connected to ground level, a drain is connected to the gate of NMOS 56N (node c) and a gate of the NMOS 54N is connected to the input terminal IN. That is to say, PMOS 54P and NMOS 54N form an inverter INV3.

A source of PMOS 56P is connected to the gate of PMOS 52P (node a), a drain is connected to the ground and a gate is connected to node c. A source of the PMOS 62P is connected to a power supply voltage VDD, a drain is connected to an output terminal OUT and a gate is connected to the source of the PMOS 56P. A source of PMOS 55P is connected to the power supply voltage VDD, a drain is connected to a gate electrode of the PMOS 52P (node a) and a gate of the PMOS 55P is connected to the input terminal IN.

A source of NMOS 56N is connected to the gate of NMOS 52N (node b), a drain is connected to VDD level and a gate is connected to node c. A source of the second NMOS 52N is connected to the ground, a drain is connected to an output terminal OUT and a gate is connected to the source of the NMOS 56N. A source of NMOS 55N is connected to the ground, a drain is connected to a gate electrode of the NMOS 52N (node b) and a gate of the NMOS 55N is connected to the input terminal IN.

When the inputted signal is dropped to a ground level at the input terminal, a level of the node c rise up. The level of node b is increased because NMOS 56N becomes on state. Therefore, NMOS 52N becomes on state, and the level of the output signal is dropped. The signal of the input terminal IN is applied to the gate of PMOS 55P in the fifth preferred embodiment. Therefore, the potential of the drain of PMOS 55P (node a) is rapidly increased, and PMOS 52P rapidly becomes off state.

When the inputted signal rises up to VDD level at the input terminal, a level of the node c is dropped down. The level of node a is decreased because PMOS 56P becomes on state. Therefore, PMOS 52P becomes on state, and the level of the output signal rises up. The signal of the input terminal IN is applied to the gate of NMOS 55N in the fifth preferred embodiment. Therefore, the potential of the drain of NMOS 55N (node b) is rapidly decreased, and NMOS 52N rapidly becomes off state.

Figure 8:
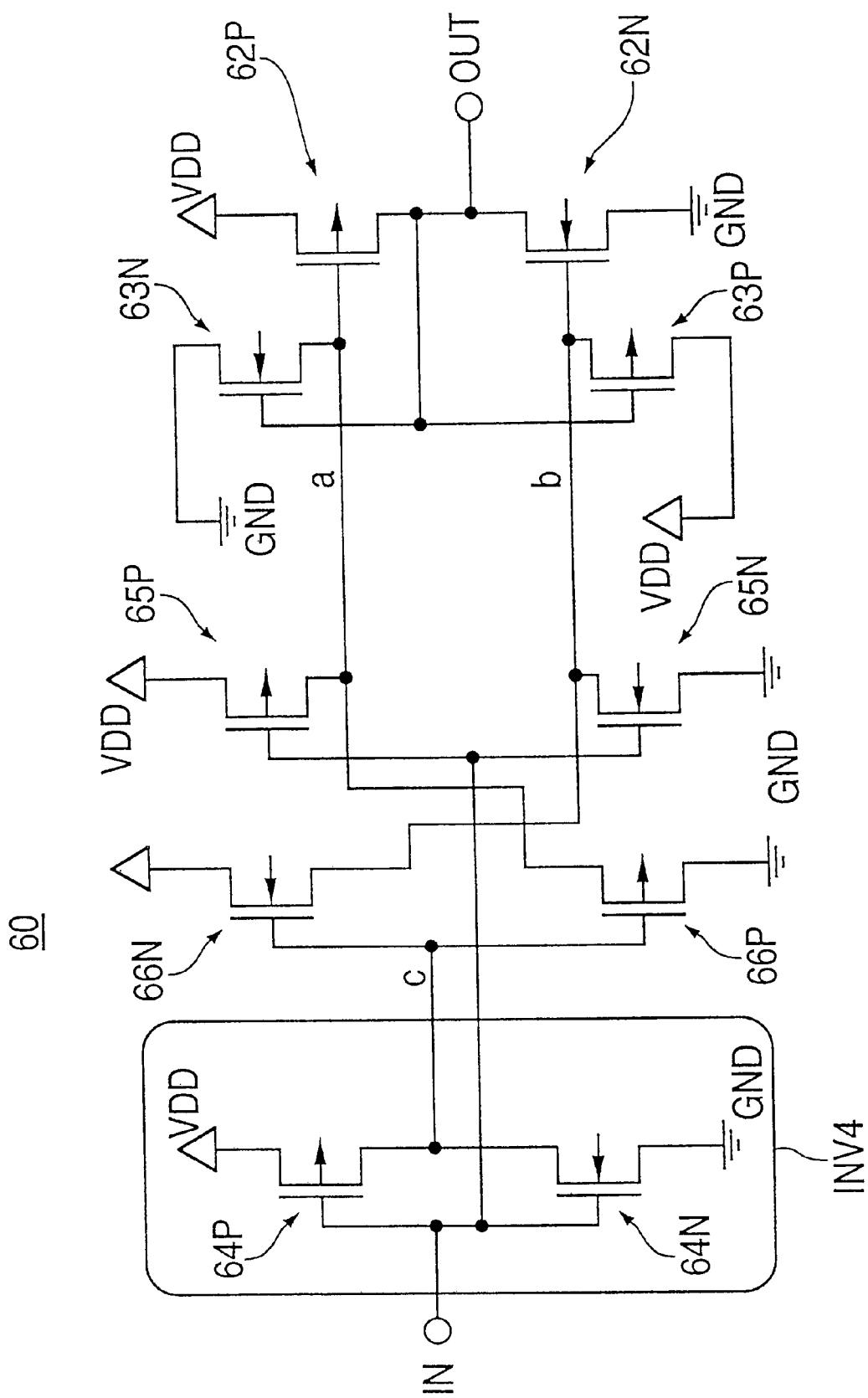
FIG. 8 shows a circuit diagram of the sixth preferred embodiment of the present invention.

FIG. 8 shows the inverter circuit 60 of a sixth preferred embodiment. The inverter circuit 60 includes NMOS 62N, NMOS 63N, NMOS 64N, NMOS 65N, and NMOS 66N as a first conductive type MOSFET. The inverter circuit 50 includes PMOS 62P, PMOS 63P, PMOS 64P, PMOS 65P, and PMOS 66P as a second conductive type MOSFET.

The PMOS 64P and the NMOS 64N are connected in series between the VDD level and the ground level. A source of the PMOS 64P is connected to VDD level, a drain is connected to the gate of PMOS 66P (node c) and a gate of the PMOS 64P is connected to the input terminal IN. A source of the NMOS 64N is connected to the ground level, a drain is connected to the gate of NMOS 66N (node c) and a gate of the NMOS 64N is connected to the input terminal IN. That is to say, PMOS 64P and NMOS 64N form an inverter INV4.

A source of PMOS 66P is connected to the gate of PMOS 62P (node a), a drain is connected to the ground and a gate is connected to node c. A source of the second PMOS 62P is connected to a power supply voltage VDD, a drain is connected to an output terminal OUT and a gate is connected to the source of the PMOS 66P. A source of the third PMOS 63P is connected to the power supply voltage VDD (a second supplied voltage), a drain is connected to a gate electrode of the second NMOS 62N (node b), and a gate of the PMOS 63P is connected to the output terminal OUT. A source of PMOS 65P is connected to the power supply voltage VDD (a second supplied voltage), a drain is connected to a gate electrode of the second PMOS 62P (node a) and a gate of the PMOS 65P is connected to the input terminal IN.

A source of NMOS 66N is connected to the gate of NMOS 62N (node b), a drain is connected to VDD level and a gate is connected to node c. A source of the second NMOS 62N is connected to the ground, a drain is connected to an output terminal OUT and a gate is connected to the source of the NMOS 66N. A source of the third NMOS 63N is connected to the ground GND (a first supplied voltage), a drain is connected to a gate electrode of the PMOS 62P (node a), and a gate of the NMOS 63N is connected to the output terminal OUT. A source of NMOS 65N is connected to the ground, a drain is connected to a gate electrode of the second NMOS 62N (node b) and a gate of the NMOS 65N is connected to the input terminal IN.

The operations of PMOS 61P, PMOS 62P, PMOS 63P, NMOS 61N, NMOS 62N and NMOS 63N of the sixth preferred embodiment are the same as the operations of PMOS 21P, PMOS 22P, PMOS 23P, NMOS 21N, NMOS 22N and NMOS 23N of the second preferred embodiment. The operations of PMOS 64P, PMOS 65P, NMOS 64N and NMOS 65N of the sixth preferred embodiment are the same as the operations of PMOS 34P, PMOS 35P, NMOS 34N and NMOS 35N of the third preferred embodiment.

The inverter circuit 60 of the sixth preferred embodiment has advantages of the second and third embodiments. The drive ability and the slew rate of the inverter circuit are improved.

What is claimed is:

1. An inverter circuit comprising:
   an input terminal;
   an output terminal;
   a first transistor;
   a second transistor connected between a power supply voltage and the output terminal,
   the first transistor being connected between the input terminal and a gate of the second transistor;
   a third transistor;
   a fourth transistor connected between a ground and the output terminal,
   the third transistor being connected between the input terminal and a gate of the fourth transistor;
   a fifth transistor connected between the ground and the gate of the second transistor; and
   a sixth transistor connected between the power supply voltage and the gate of the fourth transistor.

2. The inverter circuit as claimed in claim 1, wherein a gate of the first transistor is connected to the ground.

3. The inverter circuit as claimed in claim 1, wherein a gate of the third transistor is connected to the power supply voltage.

4. The inverter circuit as claimed in claim 1, wherein a gate of the fifth transistor and a gate of the sixth transistor are connected to the output terminal.

5. The inverter circuit as claimed in claim 1, wherein the first, second and sixth transistors are first conductivity type transistors, and the third, fourth and fifth transistors are second conductivity type transistors.

6. The inverter circuit as claimed in claim 5, wherein the first conductivity type transistors are PMOS transistors, and the second conductivity type transistors are NMOS transistors.

7. An inverter circuit comprising:
   an input terminal;
   an output terminal;
   a first transistor;
   a second transistor connected between a power supply voltage and the output terminal,
   the first transistor being connected between a first node and a gate of the second transistor;
   a third transistor;
   a fourth transistor connected between a ground and the output terminal, the third transistor being connected between the first node and a gate of the fourth transistor;
   a fifth transistor connected between the power supply voltage and the gate of the second transistor, a gate of the fifth transistor being connected to the input terminal;
   a sixth transistor connected between the ground and the gate of the fourth transistor, a gate of the sixth transistor being connected to the input terminal;
   a seventh transistor connected between the power supply voltage and the first node; and
   an eighth transistor connected between the ground and the first node.

8. The inverter circuit is claimed in claim 7, further comprising:
   a ninth transistor connected between the ground and the gate of the second transistor, a gate of the ninth transistor being connected to the output terminal; and
   a tenth transistor connected between the power supply voltage and the gate of the fourth transistor, a gate of the tenth transistor being connected to the output terminal.

9. The inverter circuit as claimed in claim 7, wherein a gate of the first transistor is connected to the ground.

10. The inverter circuit as claimed in claim 7, wherein a gate of the third transistor is connected to the power supply voltage.

11. The inverter circuit as claimed in claim 7, wherein a gate of the seventh transistor and a gate of the eighth transistor are connected to the input terminal.

12. The inverter circuit as claimed in claim 7, wherein the first, second, fifth and seventh transistors are first conductivity type transistors, and the third, fourth, sixth and eighth transistors are second conductivity type transistors.

13. The inverter circuit as claimed in claim 12, wherein the first conductivity type transistors are PMOS transistors, and the second conductivity type transistors are NMOS transistors.

14. An inverter circuit comprising:
   an input terminal;
   an output terminal;
   a first transistor, a gate of the first transistor being coupled to a first node;
   a second transistor connected between a power supply voltage and the output terminal,
   the first transistor being connected between a ground and a gate of the second transistor;
   a third transistor, a gate of the third transistor being coupled to the first node;
   a fourth transistor connected between the ground and the output terminal,
   the third transistor being connected between the power supply voltage and a gate of the fourth transistor;
   a fifth transistor connected between the power supply voltage and the gate of the second transistor, a gate of the fifth transistor being connected to the input terminal;

a sixth transistor connected between the ground and the gate of the fourth transistor, a gate of the sixth transistor being connected to the input terminal;

a seventh transistor connected between the power supply voltage and the first node; and an eighth/transistor connected between the ground and the first node.

15. The inverter circuit is claimed in claim 14, further comprising:

a ninth transistor connected between the ground and the gate of the second transistor, a gate of the ninth transistor being connected to the output terminal; and a tenth transistor connected between the power supply voltage and the gate of the fourth transistor, a gate of the tenth transistor being connected to the output terminal.

16. The inverter circuit as claimed in claim 14, wherein the first, second, fifth and seventh transistors are first conductivity type transistors, and the third, fourth, sixth and eighth transistors are second conductivity type transistors.

17. The inverter circuit as claimed in claim 16, wherein the first conductivity type transistors are PMOS transistors, and the second conductivity type transistors are NMOS transistors.

18. The inverter circuit as claimed in claim 14, wherein a gate of the seventh transistor and a gate of the eighth transistor are connected to the input terminal.

* * * * *